United States Patent [19]

Mizuguchi

[11] Patent Number: 4,981,765
[45] Date of Patent: Jan. 1, 1991

[54] THERMAL TRANSFER PRINTER FOR PRODUCING A PHOTOMASK

[75] Inventor: Jin Mizuguchi, Fribourg, Switzerland

[73] Assignee: Ciba-Geigy Corporation, Ardsley, N.Y.

[21] Appl. No.: 229,391

[22] Filed: Aug. 8, 1988

[30] Foreign Application Priority Data

Aug. 13, 1987 [CH] Switzerland ............... 3125/87

[51] Int. Cl.$^5$ ............... G03F 1/00; G03F 7/00
[52] U.S. Cl. ............... 430/5; 430/300; 430/302; 430/309
[58] Field of Search ............ 430/5, 300, 273, 302, 430/309

[56] References Cited

U.S. PATENT DOCUMENTS

| | | | |
|---|---|---|---|
| 2,146,515 | 2/1939 | Schmidt . | |
| 3,697,677 | 10/1972 | Newman | 178/6.6 R |
| 4,200,675 | 4/1980 | Flor et al. | 428/43 |
| 4,410,562 | 10/1983 | Nemoto et al. | 427/54.1 |
| 4,429,027 | 1/1984 | Chambers, Jr. et al. | 430/5 |
| 4,555,471 | 11/1985 | Barzynski et al. | 430/273 |
| 4,568,621 | 2/1986 | Aviram et al. | 430/5 |
| 4,695,527 | 9/1987 | Geissler et al. | 430/256 |
| 4,853,317 | 8/1989 | Hayes | 430/318 |

FOREIGN PATENT DOCUMENTS

| | | |
|---|---|---|
| 543537 | 2/1932 | Fed. Rep. of Germany . |
| 658771 | 4/1938 | Fed. Rep. of Germany . |
| 3537829 | 4/1987 | Fed. Rep. of Germany . |

OTHER PUBLICATIONS

Xerox Disclosure Journal., vol. 8, No. 2, Mar./Apr. 1985, p. 91.
Patent Abst. of Japan, vol. 5, No. 36 (p. 51) [708], Mar. 7, 1981.

*Primary Examiner*—Jose Dees
*Attorney, Agent, or Firm*—Stephen V. O'Brien

[57] ABSTRACT

The invention relates to the use of a thermal transfer printer and of an ink ribbon containing a pigment or dye that absorbs light in the range from 350 to 450 nm for the direct production of a photomask from an electronically coded sources of information on a metal plate (PS plate) coated with a positively working photopolymer which is sensitive to light in the range from 350 to 450 nm, and, as surface layer, with a polymer which is soluble in alkaline solution and is permeable to light in the range from 350 to 450 nm, such that the image produced by the thermal transfer printer on the PS plate is used direct as photomask.

7 Claims, No Drawings

THERMAL TRANSFER PRINTER FOR PRODUCING A PHOTOMASK

The present invention relates to the use of a thermal transfer printer and of an ink ribbon containing a pigment or a dye that absorbs light in the range from 350 to 450 nm for the direct production of a photomask from electronically coded sources of information, on a metal plate which contains a photopolymer that is sensitive to light in the range from 350 to 450 nm (presensitized plate; referred to hereinafter as PS plate).

In European patent application No. 0 065 760 the proposal is made to create a photomask direct on a PS plate by a mechanical, electromagnetic or thermal imaging process such as printing, magnetic toning or thermal laser irradiation. Ink is used for printing the photomask on the PS plate, and laser marking is used to reproduce a photomask on the PS plate on the basis of electronic information. In this method, the entire surface of the PS plate must be provided with a pigment-containing layer.

German Offenlegungsschrift No. 3 537 829 discloses a process for the production of printed circuits which, for example, comprises applying a photomask by means of a thermal transfer printer direct to the light-sensitive layer that does not have a surface layer superposed thereon. To improve adhesion of the photomask to the surface of the ligh-sensitive layer, this latter is preferably roughened.

Xerox Disclosure Journal, Vol. 8, No. 2, March/April, 1983, discloses a method of producing a photomask by means of the ink jet method instead of using a thermal transfer printer. In this method, the photomask is not applied direct to the light-sensitive layer, but to a transparent polyester film superposed thereon or to glass. Apart from the fact that such a photomask must additionally be dried, the images produced therewith do not have high resolution.

It has now been found that printing plates suitable for producing images of high resolution by the image printing method are obtained by using a thermal transfer printer and an ink ribbon containing a pigment or dye which absorbs light in the range from 350 to 450 nm for the direct production of a photomask on a PS plate after exposure and development of the irradiated PS plate.

Thermal transfer printers have long been known and are widely used for writing information also obtained from electronically coded sources. Depending on the type of ink ribbon, normal smooth paper or heat-sensitive printing paper is used.

Accordingly, the present invention relates to the use of a thermal transfer printer and of an ink ribbon containing a pigment or dye that absorbs light in the range from 350 to 450 nm for the direct production of a photomask from an electronically coded sources of information on a metal plate (PS plate) coated with a positively working photopolymer which is sensitive to light in the range from 350 to 450 nm, and, as surface layer, with a polymer which is soluble in alkaline solution and is permeable to light in the range from 350 to 450 nm, such that the image produced by the thermal transfer printer on the PS plate is used direct as photomask, preferably for an integral exposure.

The ink ribbons containing a pigment or dye used for the production of the photomask are known. Ink ribbons which may suitably be used for producing the photomask by means of a thermal transfer printer are those of the melting type as well as those of the sublimation type. It is preferred to use ink ribbons of the melting type for the production of a photomask using a thermal transfer printer. Such melting type ink ribbons contain, for example, ca. 20% by weight of a pigment, ca. 60 to 80% by weight of wax, and ca. 0 to 20% by weight of conventional auxiliaries.

The wax in the ink ribbon may suitably be, for example, carnauba wax, ester wax or paraffin wax, and customary auxiliaries are, for example, oil, stabilisers or antioxidants.

Sublimation type ink ribbons contain essentially a sublimable dye which is either vapourised under a high vacuum direct on to a condenser paper or is applied in the form of a suspension, for example in nitrocellulose, with a helical roll on to a condenser paper.

If the pigment or dye does not absorb sufficiently in the range from 350 to 450 nm, then to produce the photomask it is necessary to use an ink ribbon that additionally contains ca. 5% by weight, based on the previously specified composition of the ink ribbon, of a fluorescent whitening agent or UV absorber that absorbs light in the range of the spectrum in which the photopolymer is light-sensitive.

For the production of photomasks it is conventional to use ink ribbons that contain a yellow, red, green or black pigment or a yellow, red, green or black dye which absorbs light in the range from 350 to 450 nm.

The production of the photomask and the development of the irradiated PS plate are best carried out in a room which is illuminated with yellow light and from which UV light is excluded. In order that the photomask produced in yellow light by means of the thermal transfer printer may be better identified, it is advisable to add to the ink ribbon a blue pigment or a blue dye as complementary colour to yellow. Preferably the blue ribbon will additionally contain a fluorescent whitening agent or a UV absorber.

The pigments, dyes, fluorescent whitening agents or UV absorbers present in the ink ribbons are likewise known and some are commercially available.

Examples of pigments which absorb light in the range from 350 to 450 nm and are suitable for the production of the ink ribbons are Cromophthal ® Yellow 6G, Irgazin ® Yellow 2GLT and Irgalite ® GO, all of which are available from CIBA-GEIGY AG.

Suitable dyes which absorb light in the range from 350 to 450 nm are, for example, yellow pyrazolone dyes such as Tartrazine ®, the black dyes commercially available under the registered trademark "Special Black 7984" and "Diphenyl Black GN", red dyes such as the red dye available from Sumitomo under the registered trademark "Acid Red 35", or the leuco dyes of formulae

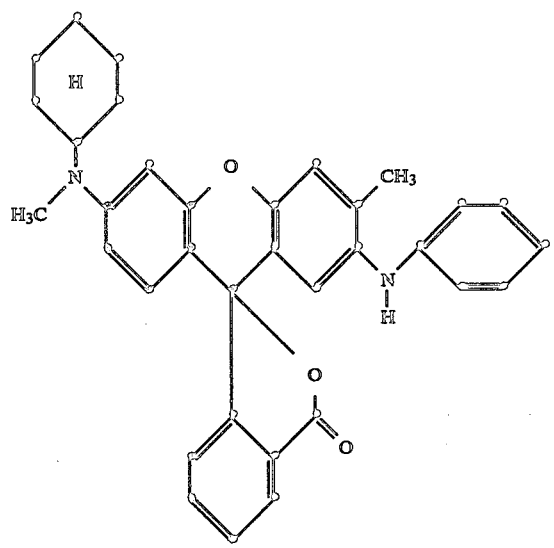
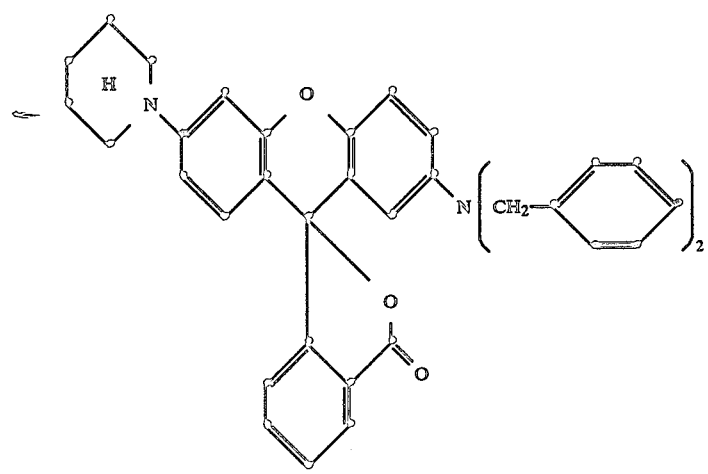
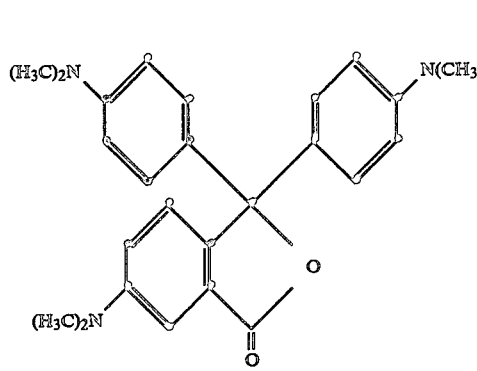 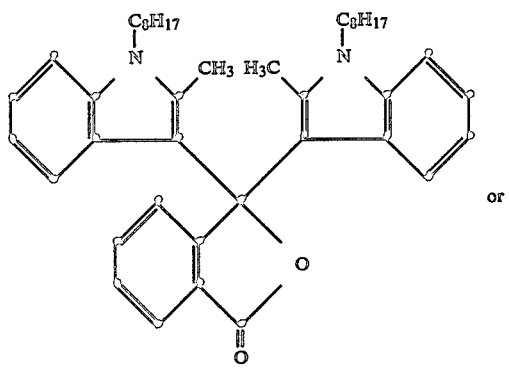

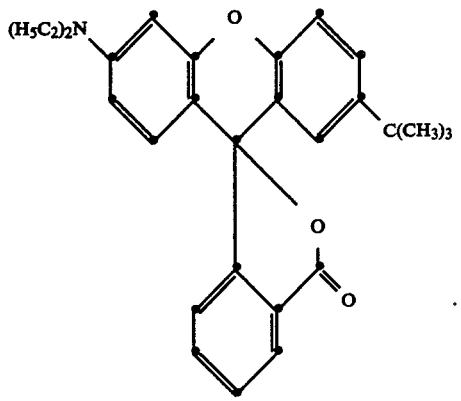

Suitable fluorescent whitening agents which may be present in the ink ribbon and which also absorb light in the range from 350 to 450 nm are, for example, those of the following formulae

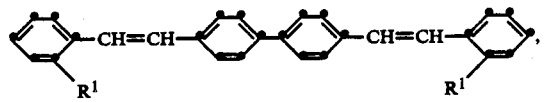

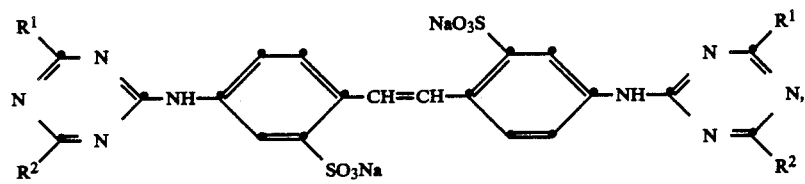

wherein $R^1$ is anilino or anilino which is substituted by one or two $Na_2SO_3$ radicals, and $R^2$ is methoxy, morpholino or bis-(2-hydroxyethyl)amino wherein $R^1$ is methoxy, cyano or $Na_2SO_3$;

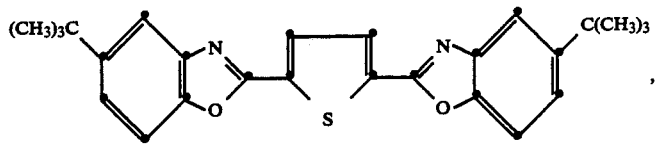

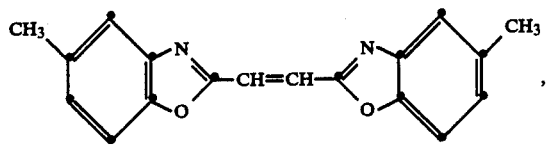

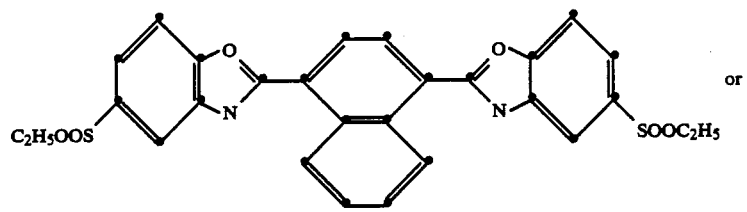

or

-continued

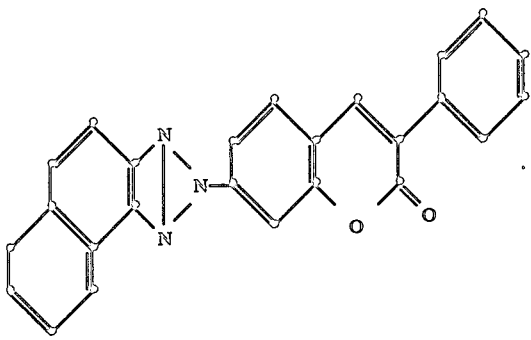

Suitable UV absorbers which absorb light in the range from 350 to 450 nm and may be present in the ink ribbons are, for example, UV absorbers of the 2-hydroxybenzophenone or 2,4-dihydroxybenzophenone type such as 2-hydroxybenzophenone, 2-hydroxy-4-alkoxybenzophenone, in which the alkoxy moiety contains 1 to 12 carbon atoms, 2,4-dihydroxybenzophenone or 2,2'-dihydroxy-4,4'-dimethoxybenzophenone.

Suitable sublimable dyes which may be present in the ink ribbons of the sublimation type are, for example, Cibacet ® Yellow 2GC (ex Ciba-Geigy AG), Dimethyl Yellow (ex Fluka) and Terasil ® Yellow (ex Ciba-Geigy AG).

Positively working photopolymers which are sensitive to light in the range from 350 to 450 nm and with which the metal plate is coated may suitably be, for example, mixtures of o-quinone diazides and novolaks (q.v. J. Kosar, "Light-Sensitive Systems", John Wiley+Sons, New York, 1965) or mixtures containing compounds having an acetal bond that can be severed in acid medium, photochemically activatable acid donors, and binders which are soluble in aqueous-alkaline medium. Such positively working compositions are disclosed, for example, in German Auslegeschrift No. 2 718 254, in U.S. patent specification No. 3 779 778, or in European patent application No. 0 202 196.

As base material for the metal plates it is preferred to use mechanically or electrochemically roughened aluminium or anodised aluminium which may also be chemically pretreated, for example with silicates or phosphates. Also suitable as base material are zinc or multi-metal plates with Cu/Cr or brass/Cr as topmost layer.

Subsequently, a surface layer of a film-forming polymer which is soluble in the alkaline developer solution and which is permeable to light in the range from 350 to 450 nm is applied to the photopolymer film on the metal plate coated with said photopolymer. Polymers which may suitably be used as surface layer are, for example, polyvinyl alcohols, alkylhydroxyalkyl cellulose, polyacrylic acid, derivatives of polyacrylic acid, polyacrylamides, polyvinyl pyrrolidones, polyvinylmethyl ethers, copolymers of maleic anhydride and vinyl or acrylic compounds and phenolic resins which are obtained by condensation of phenols with aldehydes. Examples of suitable phenols are phenol, cresol, ethyl phenol, butyl phenol or bisphenol A; and suitable aldehydes are, for example, formaldehyde, acetaldehyde, acrolein, crotonaldehyde or furfurol. As surface layer it is preferred to use a polyvinyl alcohol or a phenolic resin.

The conventional commercially available thermal transfer printers can be used to produce the photomask on the PS plate.

The photochemical modification is effected by the known method of photodecomposition by irradiation with light which is rich in shortwave radiation. Examples of suitable light sources are mercury medium pressure, hight pressure and low pressure lamps, as well as superactinic fluorescent strip lamps whose emission maxima are in the range from 350 to 450 nm. The exposure time depends on the light intensity and light sensitivity of the photopolymer and is normally from ca. 20 to 60 seconds. The irradiated PS plate is then developed in an alkaline developer solution, in the course of which the surface layer and the exposed and decomposed areas of the photopolymer film are dissolved out. The plate is then dried to give a finished printing plate which is suitable, for example, for offset writing.

The following materials and equipment are used in the Examples:

PS Plate (presensitized plate): This plate is prepared by coating an electrochemically or mechanically roughened aluminium or anodised aluminium plate with a polymer solution consisting of a mixture of the naphthoquinone-1,2-diazido-5-sulfonic acid ester of polyhydroxyphenyl prepared by polycondensation of acetone and pyrrogallol according to Example 1 of U.S. Pat. No. 3 635 709, and 2 parts by weight of a phenol novolak, dissolved in a mixture of solvents consisting of 20 parts by weight of 2-methoxyethyl acetate and 20 parts by weight of methyl ethyl ketone, and subsequently drying the coated plate. Layer thickness: 1–3 μm, Drying conditions: 5 min/60° C.

Developer solution: Alkaline solution consisting of 75 g sodium metasilicatepentahydrate (ex Fluka) and 0.4 g of a nonionic wetting agent (Supronic B50, ex ABM Chemicals Ltd) in 1000 g of water.

Thermal transfer printer: HR-5 Thermal transfer printer supplied by Brother Corp. This printer is equipped with a thermo-head, which makes it possible to use melting type and sublimation type ink ribbons.

Exposure apparatus: MO 25, 2 kW mercury lamp supplied by Silvania.

EXAMPLE 1

Using a black ink ribbon available under the registered trademark "Cassette Ribbon 6040" from Brother Corp., information from a computer is written with the thermal transfer printer direct on to the PS plate which is coated with a 2–3 μm film of polyvinyl alcohol (Moviol ® 4-88, ex Hoechst AG). The coated plate is then irradiated for 30 seconds with the mercury lamp such that the light intensity at the surface of the PS plate is ca. 1 mW cm$^2$. The irradiated PS plate is subsequently developed with the developer solution, in the course of which the thin layer of polyvinyl alcohol is removed and the exposed, decomposed areas of the PS plate are dissolved out. The developed plate is then dried to give a finished printing plate for offset printing with very good abrasive resistance (>100,000 copies) and good printing properties, especially as regards colour fading and resolution.

EXAMPLE 2

The procedure of Example 1 is repeated, replacing the black ribbon by one consisting of 20% by weight of Cromophthal ® Yellow 6G (ex Ciba-Geigy AG) and 80% by weight of carnauba wax. A finished printing plate is obtained after irradiation and development as described in Example 1.

EXAMPLE 3

The procedure of Example 1 is repeated, using a sublimation type ink ribbon, for example a ribbon containing Cibacet ® 2GC (ex Ciba-Geigy AG) vapourised on to condenser paper. A finished printing plate is obtained after irradiation and development as described in Example 1.

EXAMPLE 4

The procedure of Example 1 is repeated, using a sublimation type ink ribbon obtaining by pouring a suspension of nitrocellulose and Terasil ® Yellow 2 GW (ex Ciba-Geigy AG) on to condenser paper. A finished printing plate is obtained after irradiation and development as described in Example 1.

What is claimed is:

1. A process for the direct production of a photomask from electronically coded sources of information on a metal presensitized plate coated with a positively working photopolymer which is sensitive to light in the range of 350 to 450 nm, and, as a surface layer, with a polymer which is soluble in alkaline solution and is permeable to light in the range of 350 to 450 nm, such that the image produced by the thermal transfer printer on the metal presensitized plate is used directly as a photomask, wherein the image is made by a thermal transfer printer from an ink ribbon containing a pigment or a dye that absorbs light in the range of 350 to 450 nm by imagewise printing said plate with ink ribbon, irradiating the printed plate with light in the range from 350 to 450 nm and developing said plate in an alkaline developer solution.

2. A process according to claim 1, wherein the ink ribbon contains a yellow, red, green or black pigment or a yellow, red, green or black dye that absorbs light in the range from 350 to 450 nm.

3. A process according to claim 2, wherein the ink ribbon contains a yellow pigment or a yellow dye.

4. A process according to claim 1, wherein the ink ribbon contains a blue pigment or a blue dye and a fluorescent whitening agent or UV absorber.

5. A process according to claim 1, wherein the ink ribbon is a melting type ribbon.

6. A process according to claim 5, wherein the ink ribbon contains about 20% by weight of a pigment, about 60 to 80% by weight of wax, and 0 to 20% by weight of conventional auxiliaries.

7. A process according to claim 6, wherein the ink ribbon additionally contains about 5% by weight of a fluorescent whitening agent or of a UV absorber which absorbs light in the range of the spectrum in which the photopolymer is sensitive to light.

* * * * *